(12) United States Patent
Yu et al.

(10) Patent No.: US 8,134,169 B2
(45) Date of Patent: Mar. 13, 2012

(54) PATTERNED SUBSTRATE FOR HETERO-EPITAXIAL GROWTH OF GROUP-III NITRIDE FILM

(75) Inventors: Chen-Hua Yu, Hsin-Chu (TW); Ding-Yuan Chen, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 857 days.

(21) Appl. No.: 12/166,034

(22) Filed: Jul. 1, 2008

(65) Prior Publication Data
US 2010/0001375 A1   Jan. 7, 2010

(51) Int. Cl.
*H01L 33/00* (2010.01)
(52) U.S. Cl. ............... 257/94; 257/95; 257/96; 257/97; 257/E33.006; 257/E33.007; 257/E33.025
(58) Field of Classification Search .............. 257/94–97, 257/E33.006, E33.007, E33.025
See application file for complete search history.

(56) References Cited

U.S. PATENT DOCUMENTS

| 6,940,098 | B1 | 9/2005 | Tadatomo et al. |
| 2002/0069816 | A1 | 6/2002 | Gehrke et al. |
| 2004/0048471 | A1 | 3/2004 | Okagawa et al. |
| 2005/0179025 | A1* | 8/2005 | Okuyama et al. ............... 257/13 |
| 2007/0108459 | A1* | 5/2007 | Lu ................................... 257/98 |

FOREIGN PATENT DOCUMENTS

JP   2007324581   * 12/2007

OTHER PUBLICATIONS

English translation of JP-2007324581, Dec. 2007.*

* cited by examiner

*Primary Examiner* — Minchul Yang
(74) *Attorney, Agent, or Firm* — Slater & Matsil, L.L.P.

(57) ABSTRACT

A circuit structure includes a substrate and a film over the substrate and including a plurality of portions allocated as a plurality of rows. Each of the plurality of rows of the plurality of portions includes a plurality of convex portions and a plurality of concave portions. In each of the plurality of rows, the plurality of convex portions and the plurality of concave portions are allocated in an alternating pattern.

17 Claims, 7 Drawing Sheets

PATTERNED SUBSTRATE FOR HETERO-EPITAXIAL GROWTH OF GROUP-III NITRIDE FILM

TECHNICAL FIELD

This invention relates generally to semiconductor device manufacturing processes, and more particularly to forming crystalline group-III nitride films on silicon substrates, and even more particularly to reducing the stresses in the crystalline group-III nitride films.

BACKGROUND

Group-III nitride (often referred to as III-nitride, or III-N) compounds, such as gallium nitride (GaN) and its related alloys, have been under intense research in recent years due to their promising applications in electronic and optoelectronic devices. Particular examples of potential optoelectronic devices include blue light emitting diodes and laser diodes, and ultra-violet (UV) photo-detectors. The large bandgap and high electron saturation velocity of the III-nitride compounds also make them excellent candidates for applications in high temperature and high-speed power electronics.

Due to the high equilibrium pressure of nitrogen at typical growth temperatures, it is extremely difficult to obtain GaN bulk crystals. Owing to the lack of feasible bulk growth methods, GaN is commonly deposited epitaxially on substrates such as SiC and sapphire ($Al_2O_3$). However, a current problem with the manufacture of GaN thin films is that there is no readily available suitable substrate material whose lattice constant and thermal expansion coefficient closely matching that of GaN. Among the possible substrates for GaN, silicon substrates were explored, although the lattices of silicon substrates do not match that of GaN. Silicon substrates are attractive for GaN growth given their low cost, large diameter, high crystal and surface quality, controllable electrical conductivity, and high thermal conductivity. The use of silicon substrates promises easy integration of GaN based optoelectronic devices with silicon-based electronic devices.

Additionally, due to the lacking of appropriate substrates for growing GaN films thereon, the sizes of the GaN films are limited. Large GaN films will result in great stresses between the GaN films and the underlying substrates, and hence causing the bowing of the substrates. This may cause several adverse effects. First, a great number of defects (dislocations) will be generated in the supposedly crystalline GaN films. Second, the thicknesses of the resulting GaN films will be less uniform, causing wavelength shifts of the light emitted by the optical devices formed on the GaN films. Third, cracks may be generated in large stressed GaN films. New methods for forming GaN films free from the above-discussed problems are thus needed.

SUMMARY OF THE INVENTION

In accordance with one aspect of the present invention, a circuit structure includes a substrate and a film over the substrate and including a plurality of portions allocated as a plurality of rows. Each of the plurality of rows of the plurality of portions includes a plurality of convex portions and a plurality of concave portions. In each of the plurality of rows, the plurality of convex portions and the plurality of concave portions are allocated in an alternating pattern.

In accordance with another aspect of the present invention, a circuit structure includes a semiconductor substrate and a group-III nitride film over the semiconductor substrate. The group-III nitride film includes a plurality of portions physically disconnected from each other, wherein the plurality of portions forms an array including a plurality of rows and columns. The plurality of portions of the group-III nitride film includes convex portions and concave portions, wherein the convex portions and the concave portions are allocated in an alternating pattern in each of the plurality of rows and each of the plurality of columns.

In accordance with yet another aspect of the present invention, a circuit structure includes a silicon substrate having a top surface; a plurality of faceted structures on the top surface of the silicon substrate, wherein the plurality of faceted structures has slopes with (111) surface orientations; a plurality of faceted openings extending from the top surface of the silicon substrate into the silicon substrate, wherein surfaces of the silicon substrate in the plurality of faceted openings are sloped and have (111) surface orientations; and a gallium nitride (GaN) film. The GaN film includes a plurality of convex portions physically disconnected from each other, and directly over the plurality of faceted structures; and a plurality of concave portions physically disconnected from each other, and in the faceted openings. The plurality of convex portions and the plurality of concave portions are allocated in a checkerboard pattern. The circuit structure further includes a dielectric mask on the top surface of the silicon substrate, wherein the dielectric mask separates the plurality of convex portions and the plurality of concave portions from each other.

In accordance with yet another aspect of the present invention, a method of forming a circuit structure includes providing a semiconductor substrate; and forming a group-III nitride film over the semiconductor substrate. The step of forming the group-III nitride film includes forming a plurality of convex portions; and forming a plurality of concave portions. The plurality of convex portions and the plurality of concave portions form an array including a plurality of rows and columns, and are allocated in an alternating pattern in each of the plurality of rows and each of the plurality of the columns.

In accordance with yet another aspect of the present invention, a method of forming a circuit structure includes providing a silicon substrate having a top surface; forming a dielectric mask on a top surface of the semiconductor substrate; patterning the dielectric mask to form first openings exposing the top surface of the semiconductor substrate; etching the top surface of the semiconductor substrate through the first openings to form second openings in the semiconductor substrate; forming an additional mask to cover the second openings; patterning the additional mask and the dielectric mask to form third openings exposing the top surface of the semiconductor substrate, wherein the second and the third openings form a checkerboard pattern; epitaxially growing faceted epitaxy structures on the semiconductor substrate and in the third openings; removing the additional mask; and selectively growing a group-III nitride film. Portions of the group-III nitride film on the faceted epitaxy structures form convex portions, and portions of the group-III nitride film in the third openings form concave portions. Exposed surfaces of the dielectric mask are substantially free from a growth of the group-III nitride film.

Advantageous features of the present invention include reduced lattice mismatch between GaN films and underlying substrates, and reduced stresses caused by GaN films.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for achieving hetero-epitaxial growth of group-III nitride films on a substrate and the resulting structure are provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 1A:
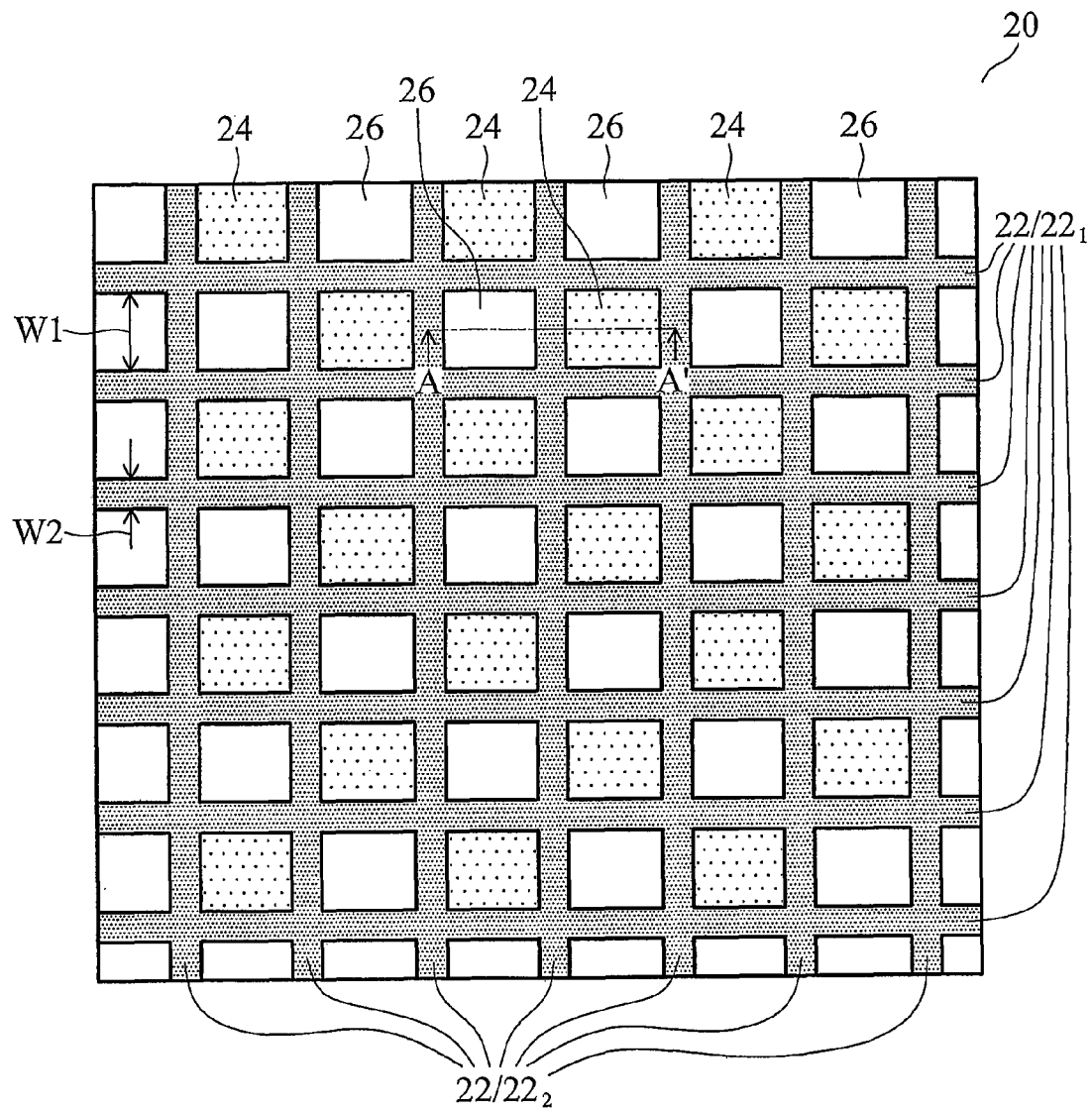
FIG. 1A illustrates a top view of an embodiment of the present invention, wherein a group-III nitride film including convex portions and concave portions are formed on a substrate.
Figure 1B:
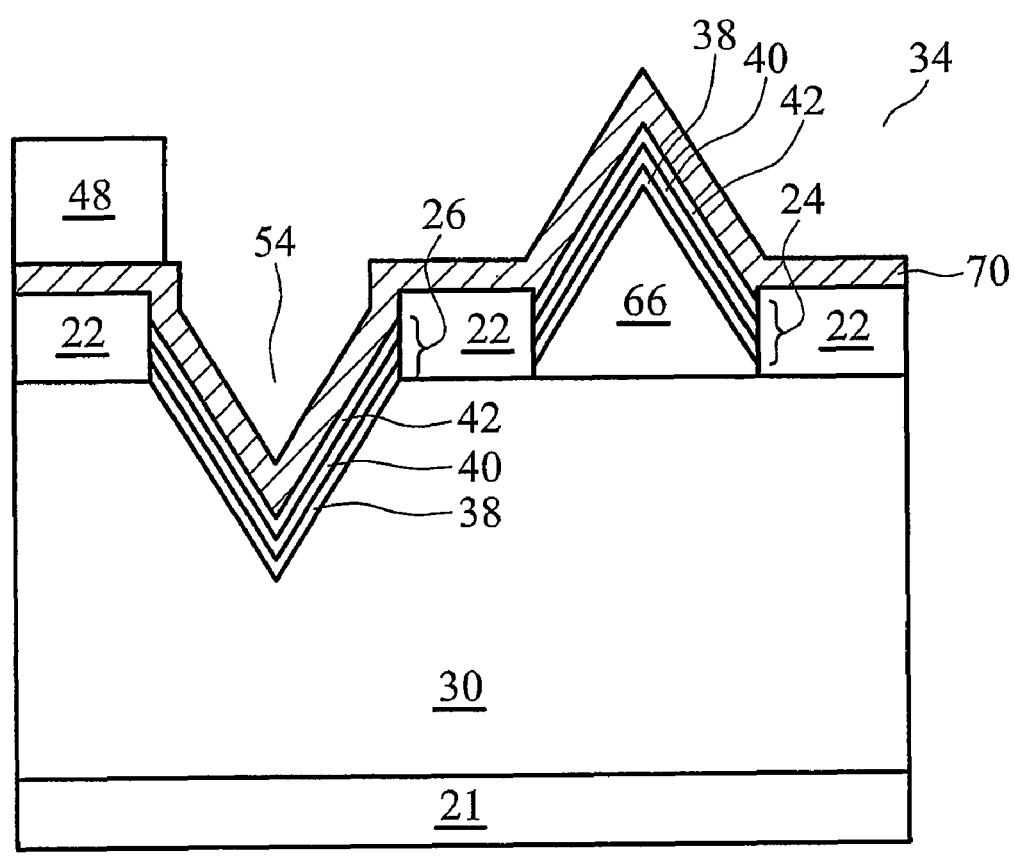
FIG. 1B illustrates a cross-sectional view of the structure shown in FIG. 1A.

FIGS. 1A and 1B illustrate a top view and a cross-sectional view, respectively, of an embodiment of the present invention. Referring to FIG. 1A, chip 20 is provided, and a top surface of chip 20 is divided by mask 22 into an array. Preferably, mask 22 is formed of a dielectric material, such as silicon oxide. Mask 22 preferably has a repeated pattern, such as a grid pattern, with parallel lines $22_1$ perpendicular to parallel lines $22_2$. In an embodiment, parallel lines $22_1$ and $22_2$ are equally spaced, and hence the spacings defined by mask 22 are rectangles, and more preferably squares (which are also a special form of rectangles). The width W1 of the spacings between the lines $22_1$ (or between lines $22_2$) of mask 22 is preferably less than about 100 μm, and more preferably between about 0.2 μm and about 10 μm. It is realized, however, that the dimensions recited throughout the description are merely examples, and different dimensions may also be used. The width W2 of parallel lines $22_1$ and/or $22_2$ is preferably between about 0.1 μm and about 10 μm. With the periodical pattern, mask 22 advantageously defines the boundaries of the subsequently formed convex structures and concave structures.

In the preferred embodiment, the array defined by mask 22 includes checkerboard patterns 24 and 26 allocated in an alternating pattern, with neighboring checkerboard patterns in any row and any column belonging to different checkerboard patterns 24 and 26. Checkerboard patterns 24 are convex structures, and hence are alternatively referred to as convex structures 24 throughout the description. On the other hand, checkerboard patterns 26 are concave structures, and hence are alternatively referred to as concave structures 26 hereinafter. Alternatively, instead of having a checkerboard pattern, convex structures 24 and concave structures 26 may be arranged with other patterns, for example, in each row, two convex structures 24 are next to each other, followed by two concave structures 26.

FIG. 1B illustrates a cross-sectional view of the structure shown in FIG. 1A, wherein the cross-sectional view is taken along a plane crossing line A-A' in FIG. 1A. FIG. 1B shows that chip 20 includes substrate 30. In an embodiment, substrate 30 is a semiconductor substrate. In the following discussed exemplary embodiment, substrate 30 is a silicon substrate, and hence is referred to as silicon substrate 30. However, substrate 30 may also be formed of other materials such as sapphire or the like. Silicon substrate 30 may be a (100) substrate having a (100) surface orientation, although it may have other surface orientations, such as (110) or (111). Silicon substrate 30 may be a bulk substrate, or a silicon-on-insulator substrate having buried oxide (not shown) between silicon layers.

In the exemplary embodiment as shown in FIG. 1B, a light-emitting diode (LED) 34 is formed over silicon substrate 30, wherein LED 34 includes N—GaN (GaN doped with an n-type impurity) layer 38, multiple quantum well (MQW) 40, p-GaN (GaN doped with a p-type impurity) layer 42, and top electrode 70. MQW 40 may be formed of, for example, InGaN, and acts as an active layer for emitting light. Each of the n-type GaN layer 38, active layer 40, and p-GaN layer 42 includes convex portions over substrate 30, and concave portions extending into substrate 30, wherein the convex portions of each of the n-type GaN layer 38, active layer 40, and p-type GaN layer 42 are physically disconnected from the respective concave portions, and are physically disconnected from each other. Top electrode 44 may extend from over convex structures 24 to over concave structures 26. Further, top electrode 44 is electrically connected to convex structures 24 and concave structures 26. Topside contact 48 may be formed on and electrically connected to top electrode 44. Backside contact 21 may be formed on and electrically connected to the backside of silicon substrate 30. Topside contact 48 and backside contact 21 form the connections to LED 34.

Referring back to FIG. 1A, LED 34 (not marked) may extend over a plurality of rows and/or columns of the array, and hence LED 34 may include a plurality of convex structures and a plurality of concave structures similar to what are shown in FIG. 1B.

Figure 1C:
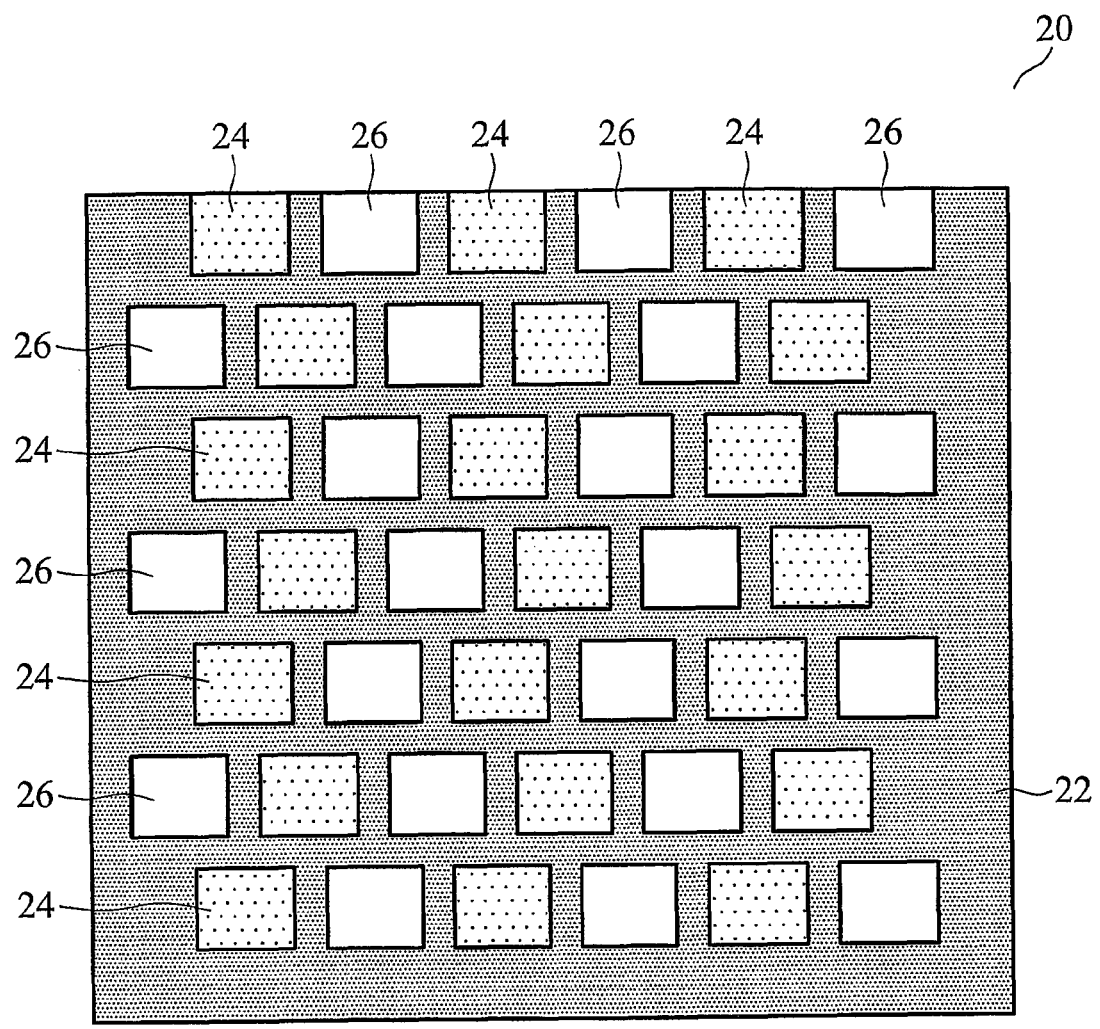
FIG. 1C illustrates a top view of an additional embodiment of the present invention, wherein the convex portions and concave portions in neighboring rows or columns are misaligned.

In alternative embodiments, particularly if substrate 30 is a silicon substrate having a (111) surface orientation, the convex structures 24 and concave structures 26 in each of the rows and columns are not aligned to the concave structures 26 and convex structures 24, respectively, in the neighboring rows or columns. Instead, convex structures 24 and concave structures 26 is aligned to the gaps between the convex structures 24 and concave structures 26 in the neighboring rows or columns, as shown in FIG. 1C.

Figure 2:
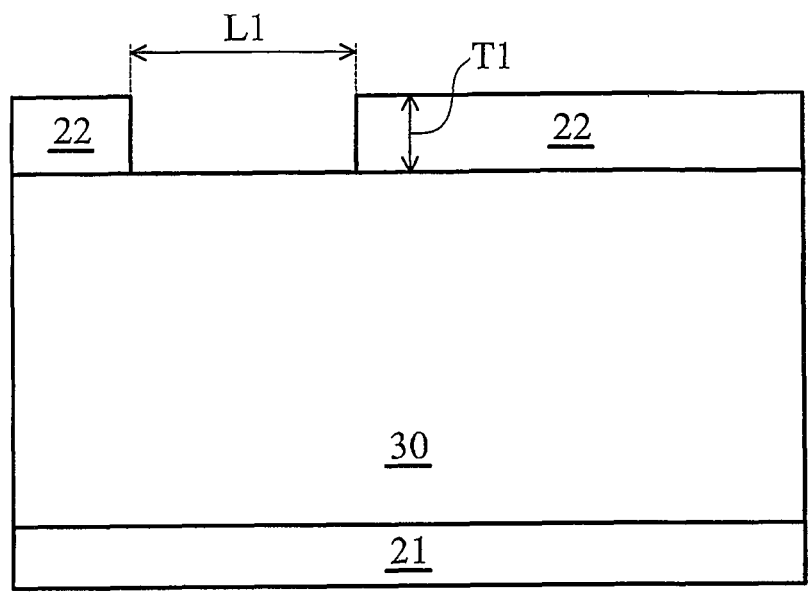
FIGS. 2 through 8 are cross-sectional views of intermediate stages in the manufacturing of an embodiment of the present invention.

FIGS. 2 through 8 illustrate cross-sectional views of intermediate stages in the formation of the exemplary embodiment as shown in FIGS. 1A and 1B, wherein the cross-sectional views are taken along the plane crossing line A-A' in FIG. 1A. In FIG. 2, silicon substrate 30 is provided, followed by the formation and the patterning of mask 22. In an embodiment, mask 22 is formed of silicon oxide, which may be a thermal oxide or a deposited oxide. Alternatively, mask 22 is formed of other materials such as silicon nitride ($SiN_x$), silicon oxynitride (SiON), aluminum oxide ($AlO_x$), or the like. The thickness T1 of mask 22 may be between about 0.1 μm and about 10 μm. The patterned mask 22 covers the regions for forming the future convex portions 24, while leaving the regions for forming the future concave portions 26 exposed. The exposed surface of substrate 30 may have length L1 less than about 100 μm, and preferably between about 0.2 μm and about 10 μm.

Figure 3:
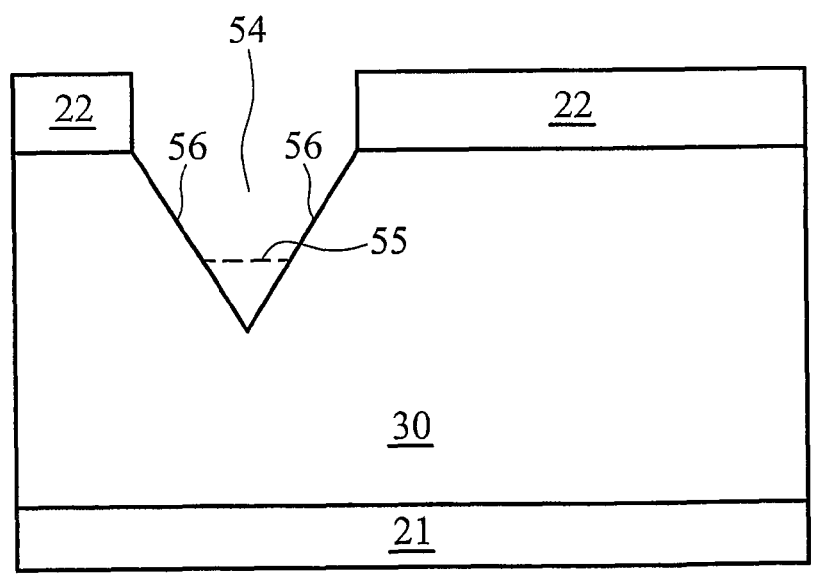

Next, as shown in FIG. 3, a wet etch is performed, for example, using a potassium hydroxide (KOH) solution for a period of time between about 5 seconds and about 30 seconds, and more preferably about ten seconds. The KOH solution may have about 45% volume percentage of KOH, which is dissolved in water. In alternative embodiments, other anisotropic wet etching solutions for (100) silicon substrates, such as potassium hydroxide/isopropyl alcohol, CsOH, tetra-methyl ammonium hydroxide (TMAH), and thylenediamine/pyrocetechol/water may also be used.

The wet etch results in the (111) surface of silicon substrate 30 to be exposed, and hence the resulting opening 54 is faceted, with slopes 56 having (111) surface orientations. If viewed from top, opening 54 has four slopes 56. Depending on the time of the wet etch, opening 54 may have a substantially ideal reversed pyramid shape, with the slopes 56 narrowed and meeting at a bottom point. Alternatively, with less wet etch time, opening 54 may have a trapezoid shape, wherein the bottom surface 55 of opening 54 may be substantially flat, as illustrated using the dashed line.

Figure 4:
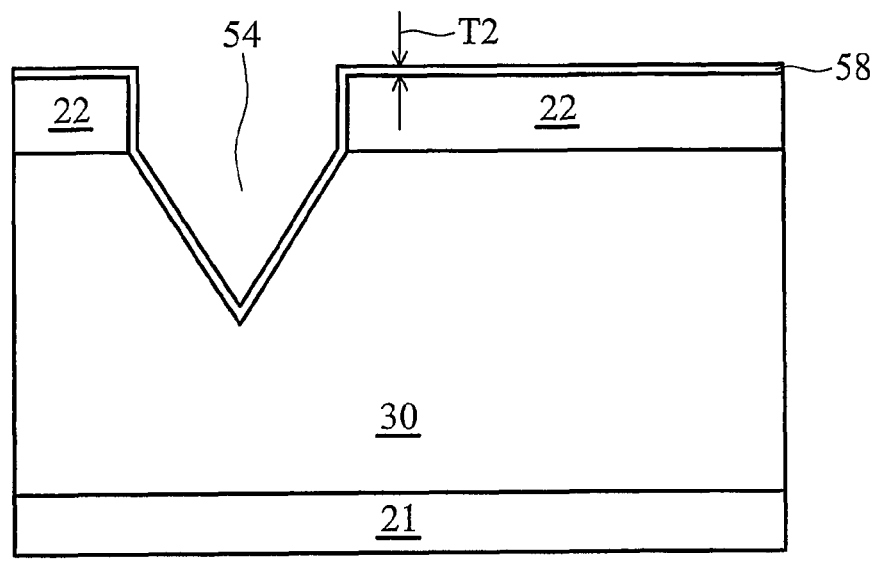

Referring to FIG. 4, a thin mask layer 58, for example, silicon oxide layer 58, is blanket deposited. Alternatively, mask layer 58 may be formed of thermal oxidation of silicon, which is formed only on exposed silicon surface in opening 54. The thickness T2 of thin mask layer 58 may be between about 0.1 μm and about 10 μm. Thin mask layer 58 may also be formed of a material different from that of mask 22. In which case, the thickness T2 may be increased.

Figure 5:
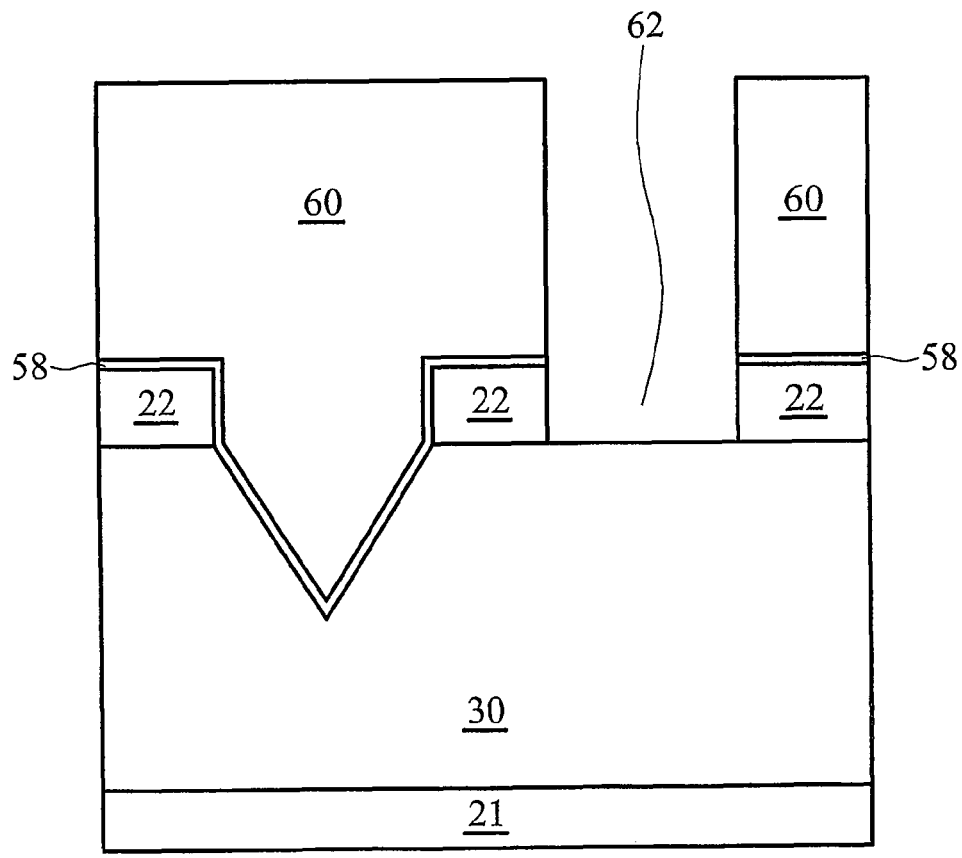

In FIG. 5, photo resist 60 is formed and patterned, so that opening 54 is covered, while a portion of mask 22 is exposed through the resulting opening 62. The exposed portion of thin mask layer 58 and mask 22 are then etched to expose the underlying silicon substrate 30. Photo resist 60 is then removed.

Figure 6:
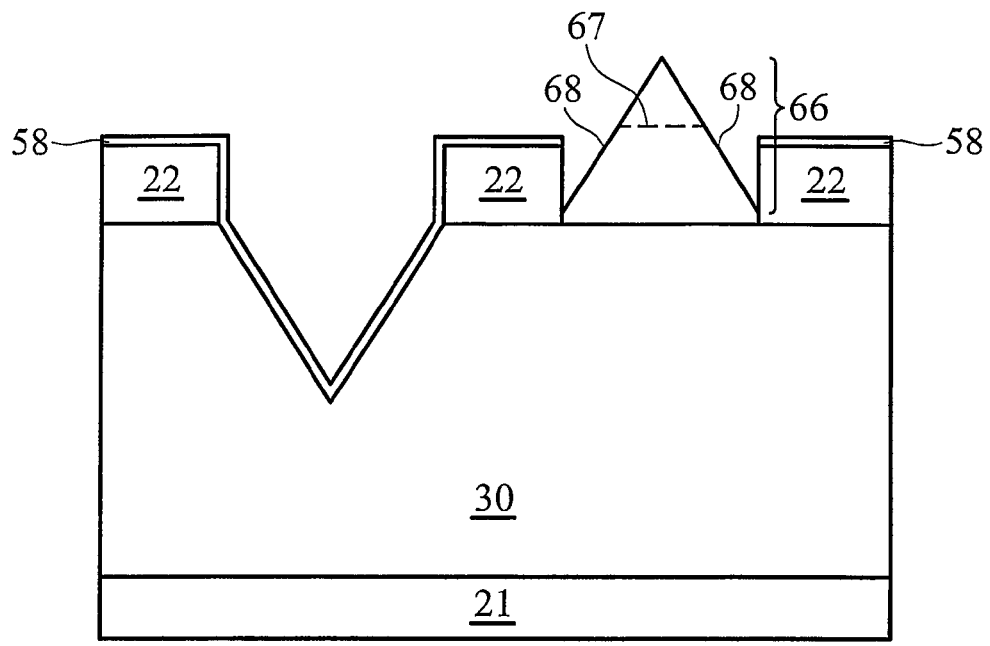

Next, as shown in FIG. 6, faceted structures 66 are epitaxially grown. Faceted structure 66 may be formed of silicon carbon (SiC), silicon germanium (SiGe), or substantially pure silicon, although p-type or n-type impurities may be in-situ doped. More preferably, the in-situ doped structure 66 has a same conductivity type as that of semiconductor substrate 30. Faceted structure 66 is formed by selective epitaxial growth, and hence is confined in opening 62. The epitaxial growth is selective, and substantially no faceted structure is formed on exposed portions of thin mask layer 58 and mask 22. In each square or rectangular spacing between the parallel lines of mask 22, one, and preferably only one, faceted structure 66 is formed. Faceted structure 66 has facets (which are the slopes of the faceted structure 66) 68. Process conditions may be adjusted to enhance the formation of facets 66. For example, the temperature for forming faceted structure 66 may be higher than about 600° C., and more preferably higher than about 700° C., so that the facet effect is enhanced. As a result, each of the faceted structure 66 may have a pyramid shape, whose base having four sides, each being defined by respective masks $22_1$ and $22_2$. From bottom to up, the four sides of faceted structure 66 become increasingly narrower. Accordingly, faceted structure 66 may have a substantially ideal pyramid shape, with the slopes 68 narrowed and meeting at a top point. Alternatively, the cross-sectional view of faceted structure 66 have a trapezoid shape, wherein the top surface 67 (dashed line) of faceted structure 66 may be substantially flat. This may be achieved, for example, with less epitaxial growth time.

Figure 7:
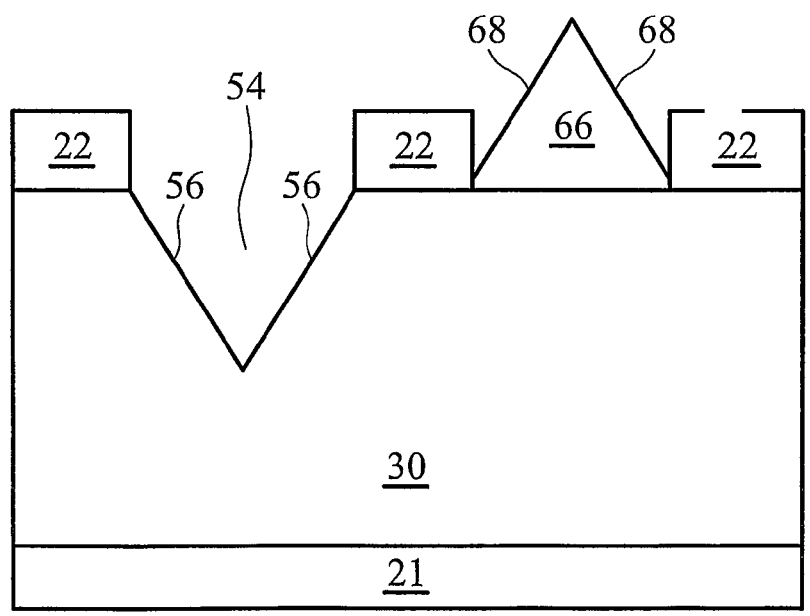

In FIG. 7, thin mask 58 is removed, for example, by an isotropic etch, wherein the etching time is controlled not to etch mask 22. In the resulting structure, the exposed surfaces 56 and 58 of opening 54 all have (111) surface orientations.

Figure 8:
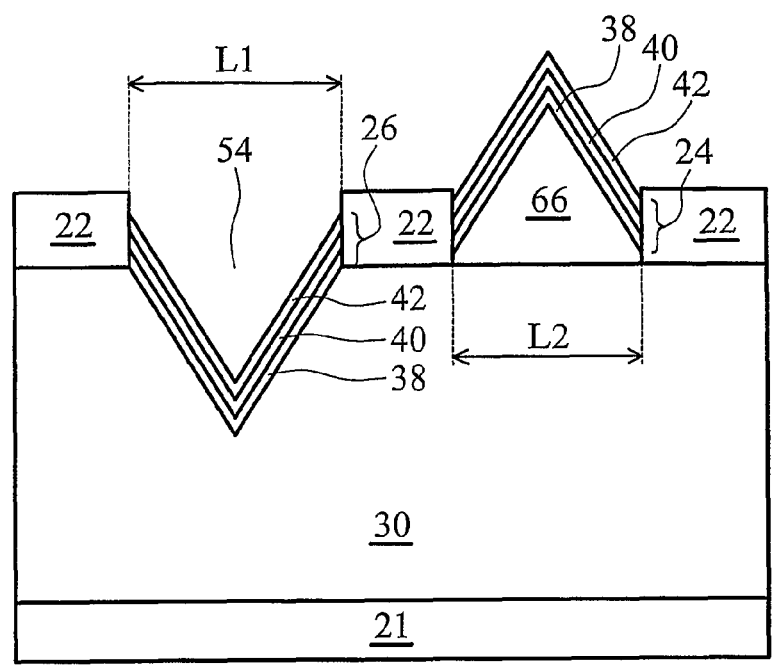

FIG. 8 illustrates the selective growth of n-type GaN layer 38, active layer 40, and p-type GaN layer 42, which are also preferably formed using selective epitaxial growth. In an exemplary embodiment, metal-organic chemical vapor deposition (MOCVD) is used. The resulting n-type GaN layer 38, active layer 40, and p-type GaN layer 42 are formed on exposed silicon (111) surfaces, but not on mask 22. Advantageously, since silicon (111) has a trigonal symmetry, the resulting GaN layers have improved crystalline structures.

Referring back to FIG. 1B, top electrode 70, which may be formed of a p-type ohmic material, such as AuZn alloy or other metallic materials, is formed. The formation methods include sputter, physical vapor deposition (PVD), or the like. In the resulting structure, each of the convex structures 24 (also refer to FIG. 1A) includes n-type GaN layer 38, active layer 40, and p-type GaN layer 42 over one of the faceted structure 66, and forms a small LED. Each of the concave structures 26 includes n-type GaN layer 38, active layer 40, and p-type GaN layer 42 in one of the openings 54 in substrate 30, and forms a small LED. Top electrode 70 interconnects the small LEDs into a large LED 34.

Figure 9:
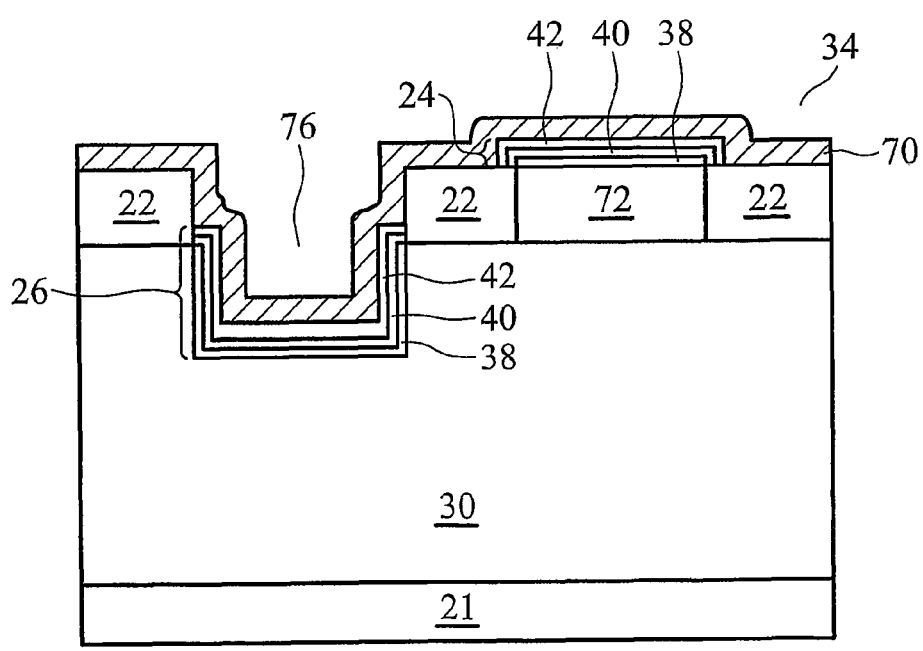
FIG. 9 illustrates a cross-sectional view of an alternative embodiment of the present invention.

FIG. 9 illustrates an alternative embodiment of the present invention. In this embodiment, the convex portion 24 (also refer to FIG. 1A) of LED 34 has substantially planar top surfaces, which are formed on conformal epitaxial silicon layer 72. The opening 76 in which the concave portion 26 of LED 34 has substantially vertical sidewalls and a substantially planar bottom. Accordingly, the concave portion 26 includes sidewall portions and a bottom portion. The processes for forming the structure shown in FIG. 9 are substantially similar to the process shown in FIGS. 2 through 8. However, when forming epitaxial silicon layer 72, the formation temperature may be lowered to reduce the facet effect, and dry etching may be used to form opening 76.

It is realized that although the formation of GaN layers are used as examples. The teaching of the present invention may be used to form any other films on substrates, whenever the total area of the films is significantly large compared to the size of the respective chip. In an exemplary embodiment, other group-III nitride materials, such as InGaN or AlInGaN, may be formed.

The embodiments of the present invention have several advantageous features. Since the epitaxially grown films (such as GaN films) have discontinued patterns, and the discontinued patterns are not at a same level, the stresses caused by the lattice mismatch between the grown films and underlying substrates are released, and hence the bowing of the chip caused by the epitaxially grown films is at least reduced. The dislocations in the films are also reduced, resulting in films with improved quality. Since the GaN films are formed on silicon (111) films, the lattice mismatch is also reduced, further reducing the stresses.

To maximize the advantageous effect of the present invention, the convex portions and concave portions of the grown films are preferably symmetric in size and in shape. For example, in FIG. 8, length L1 of the concave portion of the grown films is preferably equal to the length L2 of convex portion of the grown films. More preferably, the shape of the concave portions of the grown films is preferably identical to the shape of convex portions, except they are flipped upside down. With the symmetric structure, the stress caused by the convex portions may cancel the stress caused by the concave portions, and hence regardless of the total area of the grown films, the resulting chip will not be bowed. Accordingly, in an exemplary embodiment, if faceted structure 66 (refer to FIG. 8) has a substantially ideal pyramid shape, opening 54 preferably has a substantially ideal reversed pyramid shape. If, however, faceted structure 66 has a trapezoid shape, opening 54 preferably has a reversed trapezoid shape.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit structure comprising:
    a substrate having a top surface; and
    a film over the substrate and comprising a plurality of portions allocated as a plurality of rows, wherein each of the plurality of rows of the plurality of portions comprises:
        a plurality of convex portions, wherein each of the plurality of convex portions is substantially over the top surface of the substrate; and
        a plurality of concave portions, wherein each of the plurality of concave portions is substantially below the top surface of the substrate, wherein in each of the plurality of rows, the plurality of convex portions and the plurality of concave portions are allocated in an alternating pattern, and wherein each of the plurality of convex portions is separated from neighboring ones of the concave portions by dielectric masks.

2. The circuit structure of claim 1, wherein the plurality of portions of the film forms an array.

3. The circuit structure of claim 1 further comprising:
    epitaxial structures on the top surface of the substrate, wherein the plurality of convex portions is directly over the epitaxial structures; and
    openings extending from the top surface of the substrate into the substrate, wherein the plurality of concave portions is in the openings.

4. The circuit structure of claim 3, wherein the epitaxial structures are faceted structures, and wherein the openings have sloped sidewalls.

5. The circuit structure of claim 4, wherein each of the epitaxial structures has a substantially square base, and wherein the epitaxial structures are pyramid structures.

6. The circuit structure of claim 1 further comprising a conductive top electrode extending over, and electrically connected to, the plurality of portions of the film.

7. The circuit structure of claim 1, wherein side edges of the plurality of convex portions and side edges of the plurality of concave portions contact edges of the dielectric masks.

8. The circuit structure of claim 1, wherein the substrate comprises a silicon substrate.

9. The circuit structure of claim 1, wherein the film is a group-III nitride film, and wherein the plurality of convex portions and the plurality of concave portions are formed of a group-III nitride.

10. A circuit structure comprising:
    a silicon substrate;
    a group-III nitride film over the silicon substrate, wherein the group-III nitride film comprises a plurality of portions physically disconnected from each other, wherein the plurality of portions forms an array comprising a plurality of rows and columns, and wherein the plurality of portions of the group-III nitride film comprises:
        convex portions; and
        concave portions, wherein the convex portions and the concave portions are allocated in an alternating pattern in each of the plurality of rows and each of the plurality of columns;
    faceted structures over a top surface of the silicon substrate, wherein the convex portions are directly over the faceted structures; and
    faceted openings extending from the top surface of the silicon substrate into the silicon substrate, wherein the concave portions are in the faceted openings, and wherein the faceted structures and exposed surfaces of the silicon substrate in the faceted openings have (111) surface orientations.

11. The circuit structure of claim 10, wherein the group-III nitride film comprises an n-type gallium nitride (GaN) layer, an active layer comprising a light-emitting material over the n-type GaN layer, and a p-type GaN layer over the active layer.

12. The circuit structure of claim 10 further comprising a dielectric mask separating the plurality of portions of the group-III nitride film from each other.

13. The circuit structure of claim 10, wherein each of the convex portions is symmetric in size to each of the concave portions.

14. A circuit structure comprising:
    a silicon substrate having a top surface;
    a plurality of faceted structures on the top surface of the silicon substrate, wherein the plurality of faceted structures has slopes with (111) surface orientations;
    a plurality of faceted openings extending from the top surface of the silicon substrate into the silicon substrate, wherein surfaces of the silicon substrate in the plurality of faceted openings are sloped and have (111) surface orientations;
    a gallium nitride (GaN) film comprising:
        a plurality of convex portions physically disconnected from each other, and directly over the plurality of faceted structures; and
        a plurality of concave portions physically disconnected from each other, and in the faceted openings, wherein the plurality of convex portions and the plurality of concave portions are allocated in a checkerboard pattern; and a dielectric mask on the top surface of the silicon substrate, wherein the dielectric mask separates the plurality of convex portions and the plurality of concave portions from each other.

15. The circuit structure of claim 14, wherein each of the plurality of convex portions of the GaN film is substantially symmetric in size to each of the plurality of concave portions of the GaN film.

16. The circuit structure of claim 14, wherein the GaN film is an n-type GaN layer, and wherein the circuit structure further comprises an active layer comprising a light-emitting material on the GaN film, and a p-type GaN layer on the active layer, and wherein each of the active layer and the p-type GaN layer comprises additional convex portions and additional concave portions.

17. The circuit structure of claim 16 further comprising a continuous top electrode extending over, and electrically connected to, the additional convex portions and the additional concave portions of the p-type GaN layer.

* * * * *